United States Patent [19]

Huijer

[11] Patent Number: 4,528,529
[45] Date of Patent: Jul. 9, 1985

[54] MAGNETOSTATIC WAVE RESONATOR

[75] Inventor: Ernst Huijer, Menlo Park, Calif.

[73] Assignee: Hewlett-Packard Company, Palo Alto, Calif.

[21] Appl. No.: 560,625

[22] Filed: Dec. 12, 1983

[51] Int. Cl.³ .......................... H01P 7/08; H03H 9/15
[52] U.S. Cl. ..................................... 333/219; 310/26; 333/149; 333/235; 333/246
[58] Field of Search ............. 333/24.1, 24.2, 141–142, 333/147–148, 150–156, 193–196, 201, 219, 231, 246, 161, 149, 235; 331/107 A, 108 B, 135, 154, 157, 107 R, 107 DP, 96, 101; 310/313 R, 313 A, 313 B, 313 C, 313 D, 26

[56] References Cited

U.S. PATENT DOCUMENTS 4,028,639  6/1977  Hagon et al. .................. 333/148 X
4,392,115  7/1983  Volluet et al. .................. 333/141 X

OTHER PUBLICATIONS

Miller—"Nondispersive Magnetostatic-Volume-Wave-Delay Line", Electronics Letters, Sep. 2, 1976, vol. 12, No. 18; pp. 466–467.

Primary Examiner—Marvin L. Nussbaum
Attorney, Agent, or Firm—Edward Y. Wong

[57] ABSTRACT

A simple resonant cavity for sustaining magnetostatic waves (MSW) in a resonator device is achieved by depositing a ferrimagnetic film on a substrate and cutting two substantially parallel edges in the film. The substantially parallel edges serve as simple reflectors to replace the complex reflector arrays that are etched or otherwise formed in the prior art thin film resonators.

11 Claims, 4 Drawing Figures

MAGNETOSTATIC WAVE RESONATOR

BACKGROUND OF THE INVENTION

Ferrimagnetic material capable of sustaining magnetostatic waves (MSW) have been used for fabricating resonator devices. In the prior art, solid yttrium iron garnet (YIG), both spheres and slabs, have been found to be resonant under certain conditions, and this fact has encouraged the use of YIG films for ferrimagnetic material in MSW resonator devices. For example, J. D. Adam in "Delay of Magnetostatic Surface Waves in Y.I.G. Slab", *Electronics Letters,* Vol. 6, No. 22 (1970) and L. K. Brundle et al, in "Magnetostatic Surface Waves on a Y.I.G. Slab," *Electronics Letters,* Vol. 4, No. 7 (1968) discuss resonance of YIG slabs; and J. P. Castera et al. In "Magnetostatic Wave Resonators," Proc. of 1981 RADC, 218–228 (1981) discuss resonance of YIG thin film devices. In these prior art MSW thin film resonator devices, complex array reflectors are required to be formed on the films as resonant cavities for the device. Such complex array reflectors usually are patterned with mask and etch techniques on the YIG film, or they are formed in the film by ion-implantation. Neither an etch technique nor an ion-implantation technique in the fabrication of a MSW resonator device is considered simple or economical.

In accordance with the preferred embodiment of the invention, a YIG film is formed with two straight and substantially parallel edges on a substrate. These simple substantially parallel edges, which act as reflectors, constitute the resonant cavity of the device and obviate the required complex and expensive construction of array reflectors of the prior art. Furthermore, because of the planar structure of the resonant cavity, less space and less volume of magnetic field are required than for prior art YIG spheres, which require three-dimensional, and hence more voluminous, cavities.

DETAILED DESCRIPTION OF THE INVENTION

Figure 1:
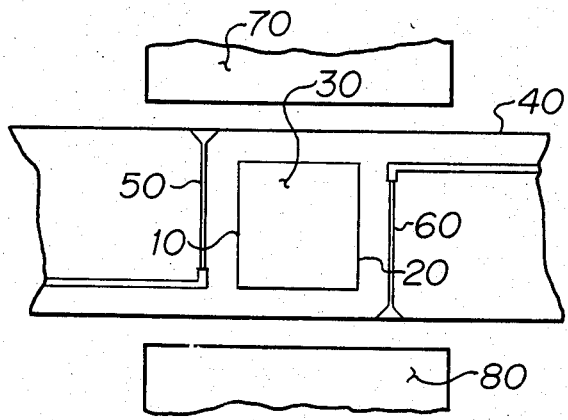
FIG. 1 shows a top view of a MSW resonator in accordance with the invention.

MSW has been investigated extensively, both experimentally and theoretically. It has been found that the distance L between two reflectors gives rise to resonance when:

$$(k_+ + k_-)L = 2\pi n, \quad n=1, 2 \ldots,$$

where $k_+$ and $k_-$ refer to possibly different wave vector values for the two opposite directions of wave propagation between the reflectors 10, 20 shown in FIG. 1. For every integer n, there is a set of wave numbers $k_+$ and $k_-$ for which the above relationship holds. Due to the dispersive character of the material, a family of resonant modes with equal spacings in the $(k_+ + k_-)$ domain, but different spacings in the frequency domain, exists.

In accordance with the present invention, substantially parallel straight edges 10, 20 of a ferrimagnetic material, such as YIG, are used as MSW reflectors to support resonance. As depicted in FIG. 1, a planar film 30 of YIG material having two substantially parallel edges 10, 20 is created, for example, by cutting with a wafer saw a film epitaxially grown, on a substrate 40, such as gadolinium gallium garnet (GGG). Typical dimensions of such a resonator are 10 to 100 microns for the YIG film thickness, 254 microns for the GGG substrate thickness, 2 mm for the cavity length and 4 mm for the transverse dimension.

In the preferred embodiment of the invention, electromagnetic energy is coupled to and from the resonant cavity comprising a film 30 of ferrimagnetic material having two reflective parallel edges 10, 20 by one or two transducers 50, 60. These transducers are in the form of microstrips 50, 60 running substantially parallel to the reflective edges 10, 20. Such transducers can typically be built with thin film technology. For example, a metal pattern of the transducer microstrip 50, 60 is deposited on one side of an alumina or fused silica substrate 90 of 254 to 508 micron thickness. The substrate is then provided with a ground plane 100 on the opposite side. In the preferred embodiment, the transducer microstrip is typically made 30–50 microns wide and a 4 mm long.

Figure 2A:
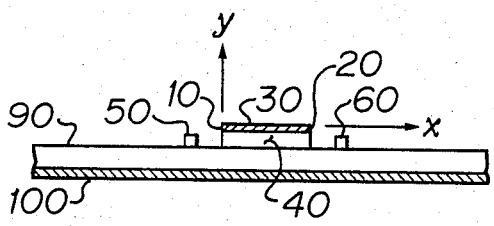
FIGS. 2A–2C show cross-sections of different embodiments of the invention.
Figure 2B:
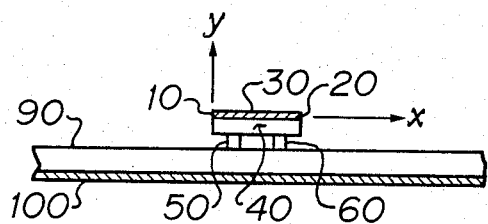
Figure 2C:
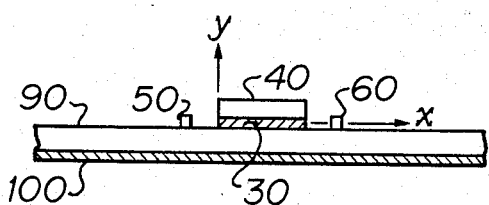

As shown in the analysis above, a family of resonant modes occurs rather than just one mode. Preferably, however, only one mode is dominant in amplitude, while the remaining modes are suppressed. In the preferred embodiment, this mode suppression is achieved when the transducers 50, 60 are partially decoupled by having them spaced away from the resonant cavity 30 in either the x- or y- direction, or both, as shown in FIGS. 2A–2C.

The resonator device in accordance with the invention can be made tunable by subjecting the total area of the film 30 over which magnetostatic waves extend to a variable uniform magnetic field. In the preferred embodiment, magnet poles 70, 80 are placed adjacent to the film 30 such that the magnetic bias field is normal to the direction of the waves resonating within the film 30. The magnitude of the magnetic bias field determines the frequency of resonance, and if this field can be varied in magnitude, e.g., with an electromagnet, then the device is a tunable resonator. As illustration, a resonator with a $4 \times 1.4 \times 0.0217$ mm YIG film as the resonant cavity has a tuning range of approximately 3–9 GHz with a bias field of 497–2495 Oersted. In addition to tuning, the magnetic bias field, through its orientation in relation to the cavity film, also determines the type of magnetostatic waves the resonator will sustain, that is, whether the waves will be surface waves (MSSW), forward volume waves (MSFVW) or backward volume waves (MSBVW).

I claim:

1. A resonator device comprising:
   a substrate having a planar surface;
   a film of ferrimagnetic material having at least two substantially parallel reflective edges for supporting resonance, said film being formed on a portion of said planar surface; and
   transducer means adjacent to at least one of said substantially parallel reflective edges but separate from said film on said planar surface for coupling electromagnetic energy to said resonator.

2. The resonator device as in claim 1 wherein said film comprises yttrium iron garnet (YIG).

3. The resonator device as in claim 2 wherein said substrate comprises gadolinium gallium garnet (GGG).

4. The resonator device as in claim 2 wherein said YIG film is expitaxially grown on said substrate.

5. The resonator device as in claim 1 wherein said transducer means comprises a microstrip parallel to said substantially parallel edges.

6. The resonator device as in claim 1 wherein said transducer means comprises a microstrip adjacent and parallel to each of said substantially parallel edges.

7. The resonator device as in claim 1 wherein said transducer means comprises a microstrip spaced parallel to and removed along an x-direction from each of said substantially parallel edges, said x-direction being perpendicular to both of said substantially parallel edges.

8. The resonator device as in claim 1 wherein said transducer means comprises a microstrip spaced parallel to and removed along a y-direction from each of said substantially parallel edges, said y-direction being normal to said planar surface.

9. The resonator device as in claim 1 wherein said transducer means comprises a microstrip spaced parallel to and removed along both x- and y-directions from each of said substantially parallel edges, said x-direction being perpendicular to both of said substantially parallel edges and said y-direction being normal to said planar surface.

10. The resonator device as in claim 1 further comprising a magnetic means magnetically coupled to said ferrimagnetic film for providing a magnetic bias field thereto.

11. The resonator device as in claim 7 wherein said magnetic means further provides a variable magnetic bias field to said ferrimagnetic film.

* * * * *

UNITED STATES PATENT AND TRADEMARK OFFICE
CERTIFICATE OF CORRECTION

PATENT NO. : 4,528,529

DATED : July 9, 1985

INVENTOR(S) : Ernst Huijer

It is certified that error appears in the above-identified patent and that said Letters Patent is hereby corrected as shown below:

Column 1, Line 53

Delete "$(k_+ + k)L=2\pi n, \quad n=1,2...,$" and insert --$(k_+ + k_-)L=2\pi n, \quad n=1,2...,$--

Signed and Sealed this

Twenty-sixth Day of November 1985

[SEAL]

Attest:

DONALD J. QUIGG

Attesting Officer

Commissioner of Patents and Trademarks